(12) United States Patent
Nishizawa et al.

(10) Patent No.: US 7,701,053 B2
(45) Date of Patent: Apr. 20, 2010

(54) ELECTRONIC COMPONENT AND METHOD FOR PRODUCING THE SAME

(75) Inventors: Yoshihiko Nishizawa, Yasu (JP); Norio Sakai, Moriyama (JP); Isao Kato, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 573 days.

(21) Appl. No.: 11/113,090

(22) Filed: Apr. 22, 2005

(65) Prior Publication Data
US 2005/0184384 A1  Aug. 25, 2005

(51) Int. Cl.
H01L 23/12 (2006.01)
(52) U.S. Cl. ............... 257/704; 257/713; 257/714; 257/723; 257/E21.502; 257/E23.068; 257/E23.084; 165/80.2; 165/185; 361/697; 361/702; 361/703; 361/710
(58) Field of Classification Search ............. 257/704, 257/713, 714, 171, 723, E21.502, E23.068, 257/E23.098; 165/80.2, 185; 361/702, 703, 361/710
See application file for complete search history.

(56) References Cited

U.S. PATENT DOCUMENTS

| 6,035,524 | A * | 3/2000 | Suppa et al. ............. 29/832 |
| 6,251,709 | B1 * | 6/2001 | Yoshikawa ............. 438/123 |
| 6,413,353 | B2 * | 7/2002 | Pompeo et al. ......... 156/307.3 |
| 6,599,770 | B2 * | 7/2003 | Miyamoto ............. 438/48 |
| 6,979,899 | B2 * | 12/2005 | Edwards ............. 257/704 |
| 7,050,304 | B2 * | 5/2006 | Hsu et al. ............. 361/719 |
| 2002/0053127 | A1 * | 5/2002 | Uchikoba ............. 29/601 |

FOREIGN PATENT DOCUMENTS

| JP | 63-220597 A | 9/1988 |
| JP | 5-3383 A | 1/1993 |
| JP | 09-097990 | 4/1997 |
| JP | 2000-188298 A | 7/2000 |
| JP | 2001-168493 | 6/2001 |
| JP | 2003-078229 | 3/2003 |
| JP | 2004-335865 | 11/2004 |

OTHER PUBLICATIONS

Official communication issued in counterpart Japanese Application No. 2003-131793, mailed on May 15, 2007.
Official communication issued in counterpart Japanese Application No. 2003-131793, mailed on Nov. 27, 2007.

* cited by examiner

Primary Examiner—Dao H Nguyen
(74) Attorney, Agent, or Firm—Keating & Bennett, LLP

(57) ABSTRACT

An electronic component has a portion adjacent to a surface of a base to which elements are mounted is immersed into a liquid resin or semi-solid resin such that an element surface of the base to which the elements are mounted is not immersed and in which the resin is then hardened. This causes a gap to be disposed between the hardened resin and the element surface of the base, such that a cover supported by some of the elements is formed.

6 Claims, 7 Drawing Sheets

ELECTRONIC COMPONENT AND METHOD FOR PRODUCING THE SAME

BACKGROUND OF THE INVENTION

1. Field of the Invention

The present invention relates to a cover of an electronic component and a method for producing the same.

2. Description of the Related Art

An electronic component of interest for the present invention is a multi-layer substrate. In general, the multi-layer substrate includes a base, elements such as integrated circuits (ICs) or large scale integrated circuits (LSIs)) disposed on the base, and a cover formed of, for example, metal or resin. The base includes a lamination of a plurality of insulating layers having through holes and wiring circuits. The cover is arranged, for example, to protect the elements and to provide a flat adhesion surface required when mounting the cover to a mother board. However, when mounting the resin cover to the base whose surface to which the elements are mounted includes through holes, if the resin enters the openings of the through holes, conduction failure occurs.

To overcome this problem, Japanese Unexamined Patent Application Publication No. 2001-168493 discloses a method for producing an electronic component in which a metallic plate is provided for each through hole so as to cover each through hole, and thus, prevent the resin from entering each through hole.

According to the aforementioned document, however, in order to cover the through holes, it is necessary to dispose metallic plates that are larger than the area of the openings of the through holes. Therefore, in a small electronic component, elements cannot be mounted with such a small pitch.

An increase in wiring density tends to increase the number of through holes formed in the base, and a reduction in the size of the component tends to reduce the area of the openings of the through holes. Therefore, when each of the through holes is covered with a very small metallic plate as in the aforementioned document, costs are considerably increased. In addition, when the very small metallic plates are disposed at predetermined locations, gaps may be formed between the metallic plates and the openings of the through holes. If these gaps are formed, resin is not prevented from entering the through holes, and as a result, quality control problems are not entirely eliminated when mass production is considered.

SUMMARY OF THE INVENTION

To overcome the problems described above, preferred embodiments of the present invention provide an electronic component and a method for producing the same, which overcome the aforementioned problems.

According to a first preferred embodiment of the present invention, an electronic component is provided which includes a base, elements mounted on the base, and a cover covering the elements. The cover is supported by the elements, and a gap is disposed between the cover and the base.

It is not required that every element supports the cover. Accordingly, the cover need not be supported by all of the elements that are mounted on the base. The cover may be supported by a portion of the elements as long as the cover is stably supported by the elements.

Preferably, a top surface of a tallest of the elements mounted on the base is embedded in the cover.

The top surface of the tallest of the elements mounted on the base and a top surface of the cover are disposed at substantially the same height. One purpose of disposing the cover at this height is to provide a flat adhesion surface when mounting the cover to, for example, a mother board. Therefore, the cover need not completely cover the elements. That is, the cover may be configured to be mounted on the top surfaces of the elements.

The top surface of the cover is preferably flat, and made of resin.

Preferably, the cover includes a plate that is adhered to top surfaces of the elements or the top surface of the tallest of the elements.

According to a second preferred of the present invention, a method for producing an electronic component includes the step of forming a cover by immersing a portion adjacent to a surface of the base to which elements are mounted into a semi-solid or liquid resin, such that a principal surface of the base is not immersed, and by hardening the resin.

With the surface of the base to which the elements are mounted facing downward, the elements are immersed in an insulating resilient material, such as a liquid resin or a semi-solid resin. After the insulating resilient material has hardened, the hardened insulating resilient material is removed, resulting in the formation of the cover. The method for producing an electronic component prevents entry of the resin into through holes in the base, and thus, prevents conduction failure of the electronic component.

In addition, a thinner electronic component can be provided by embedding the elements in the cover.

These and other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below taking a multi-layer substrate as an example of an electronic component according to the present invention.

First Preferred Embodiment

Figure 1:
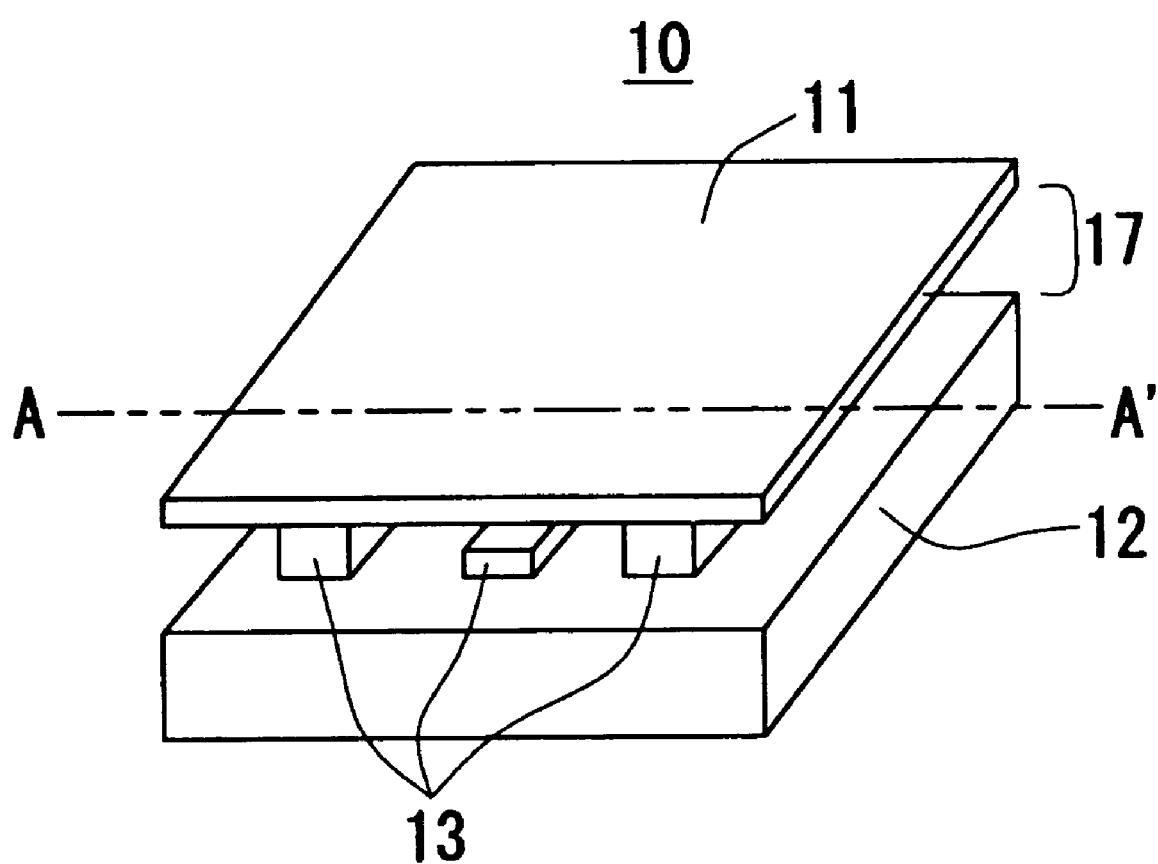
FIG. 1 is an external perspective view of a multi-layer substrate, which is an example of an electronic component, in accordance with a first preferred embodiment of the present invention.

FIG. 1 is an external perspective view of a multi-layer substrate 10 in accordance with a first preferred embodiment of the present invention. In the multi-layer substrate 10, elements 13 are mounted to a base 12, and a cover 11 is supported by some of the elements 13 and covers the elements 13.

Figure 2:
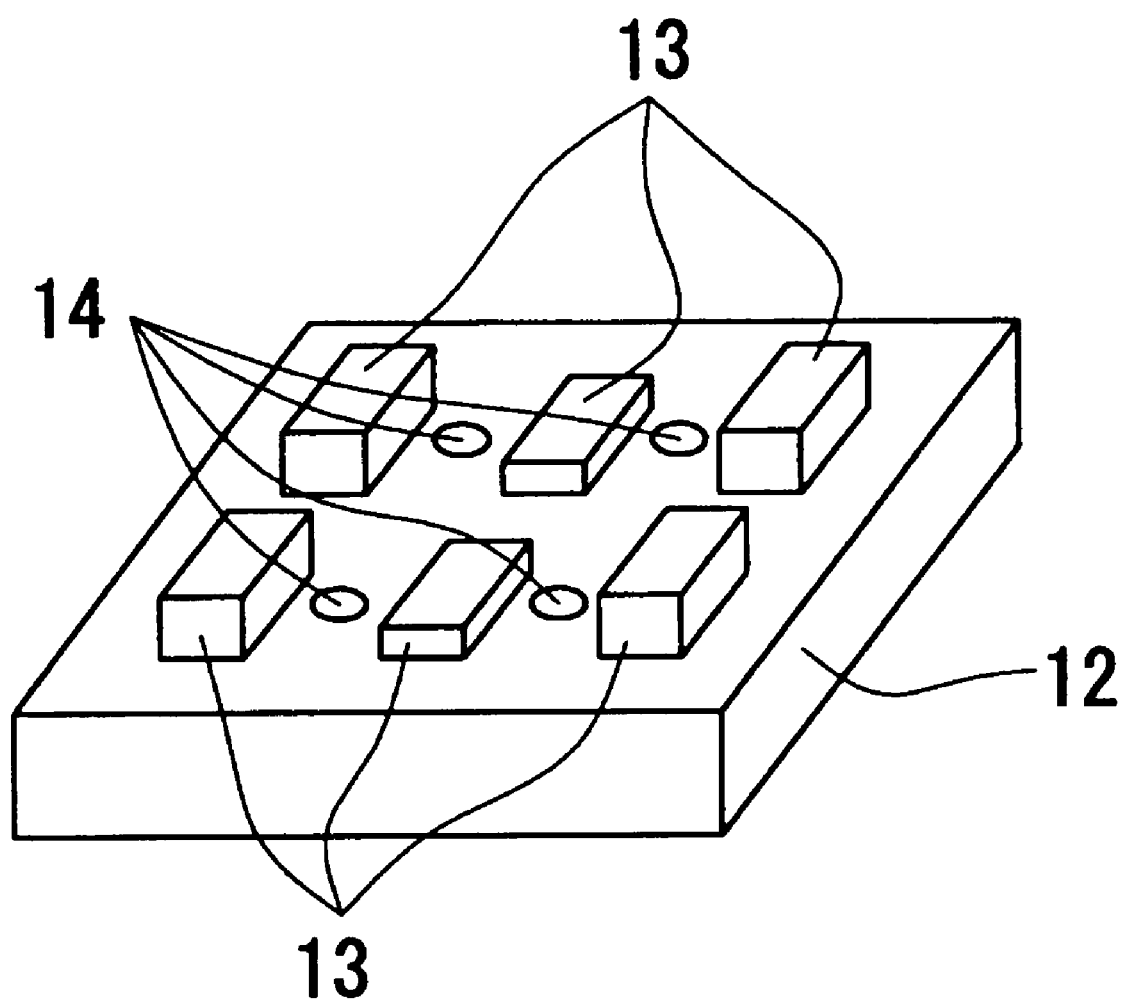
FIG. 2 is an external perspective view of the multi-layer substrate in accordance with the first preferred embodiment of the present invention.

The base 12 is formed, for example, in the following manner. Wiring circuits are formed on a desired number of ceramic sheets, and the ceramic sheets are laminated. Thereafter, through holes filled with conductive paste for electrically connecting the ceramic sheets are formed, after which the resulting structure is fired. Then, the wiring circuit disposed on a principal surface of the base is coated, and the elements 13 are soldered and mounted to the wiring circuit. FIG. 2 is a perspective view of an element surface of the base 12 without the cover 11 shown in FIG. 1. The elements 13 are mounted to the element surface of the base 12, and through holes 14 are disposed in the element surface.

The cover 11, which is an insulating member made of, for example, resin, is disposed above the base 12 such that a space 17 is provided between the cover 11 and the base 12, and such that the cover 11 is supported by some of the elements 13. Although it is preferable that the cover 11 be arranged such that no portion of the cover 11 contacts the element surface of the base 12, a portion of the cover 11 may contact the element surface of the base 12 as long as it does not contact any of the through holes 14.

Figure 3:
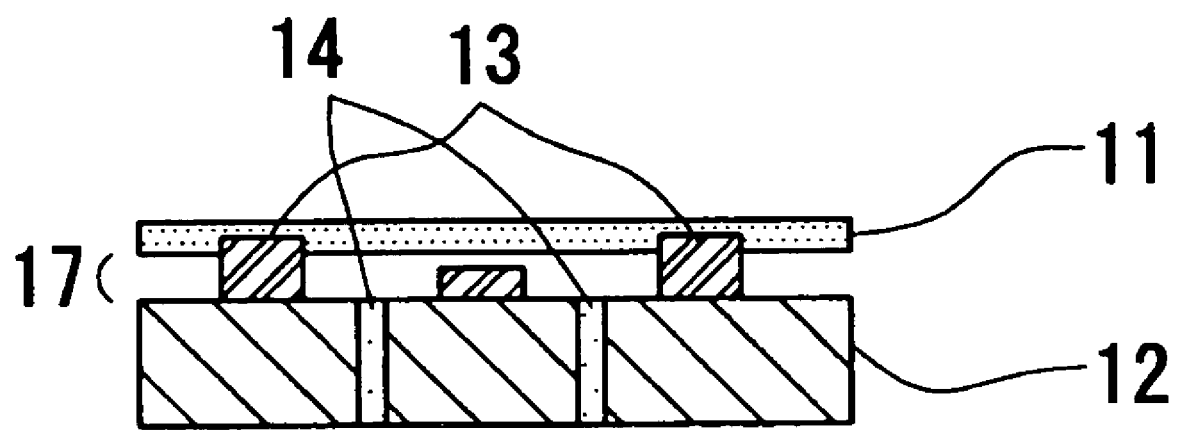
FIG. 3 is a sectional view of the multi-layer substrate in accordance with the first preferred embodiment of the present invention.

FIG. 3 is a sectional view of the multi-layer substrate 10 shown in FIG. 1 taken along line A-A'. As shown in FIG. 3, the cover 11 is supported by the tallest of the elements 13 when the elements 13 are mounted on the base 12. Although it is preferable for all of the mounted elements 13 to support the cover 11 such that the cover 11 is more stably supported and integral with the base 12, the cover 11 is still stably supported when it is supported by only the tallest of the elements 13 on the base 12.

The size of a principal surface of the cover 11 may be larger or smaller than the size of the principal surface of the base 12 as long as the stability of the cover 11 is maintained.

The cover 11 is more stably supported when the top surfaces of the tallest of the elements 13 on the base 12 are embedded in the cover 11. If the top surfaces of the elements 13 and the top surface of the cover 11 are substantially at the same height, that is, the elements 13 are embedded to a maximum extend in the cover 11 or the elements 13 and the cover 11 have substantially the same height, the thickness of the multi-layer substrate 10 is reduced, thereby reducing the size of the component.

Second Preferred Embodiment

FIGS. 4A and 4B and FIGS. 4C to 4E are, respectively, external perspective views and sectional views for illustrating a method for producing a multi-layer substrate in accordance with a second preferred embodiment of the present invention. Elements shown in FIGS. 4A to 4E that correspond to those shown in FIG. 1 are given the same reference numerals, and descriptions thereof are omitted.

Figure 4A:
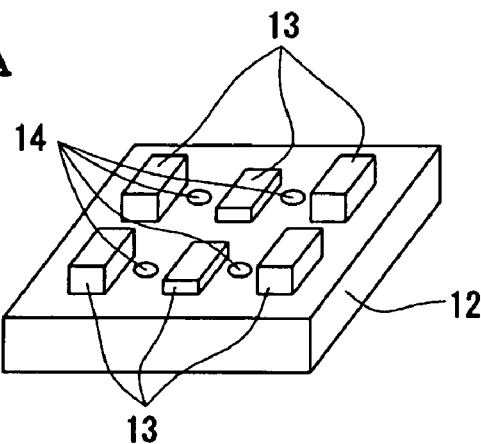
FIGS. 4A and 4B and FIGS. 4C to 4E are, respectively, external perspective views and sectional views illustrating a multi-layer substrate, which is an example of an electronic component, in accordance with a second preferred embodiment of the present invention.

First, as shown in FIG. 4A, a base 12 having elements 13 mounted thereon, is provided.

Next, a tray (container) 32 is filled with a predetermined amount of liquid insulating material, such as epoxy resin. This resin 31 may be a liquid or a semi-solid and its viscosity is not particularly limited as long as the elements can be immersed in the resin 31. The tray 32 is also previously coated with a separation agent such that the hardened resin 31 can be easily removed from the tray 32.

Figure 4B:
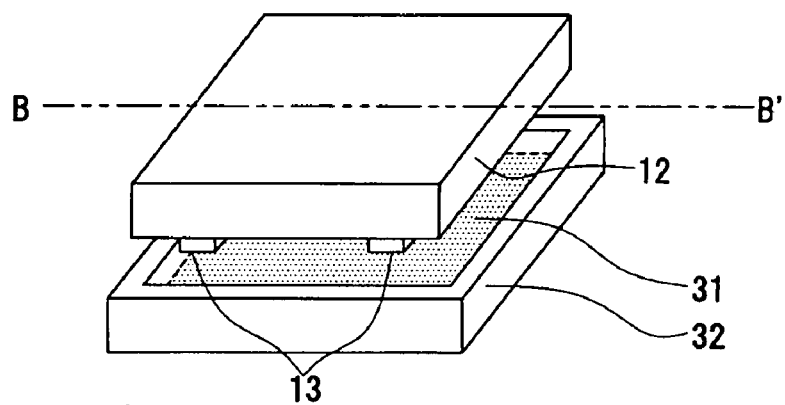

Next, as shown in FIG. 4B, with an element surface of the base 12 to which the elements 13 are mounted facing downward and the bottom surface of the base 12 facing upward, the elements 13 are inserted into the tray 32 to a depth at which the base 12 is not immersed, and the resin is hardened. The outside air temperature and time required for hardening the resin depend upon the type of resin being used. The epoxy resin used in this preferred embodiment hardens at an outside air temperature of from about 100° C. to about 150° C. and when left standing for about 1 hour to about 3 hours.

Figure 4C:
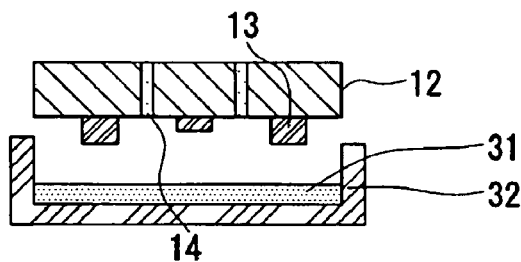
Figure 4D:
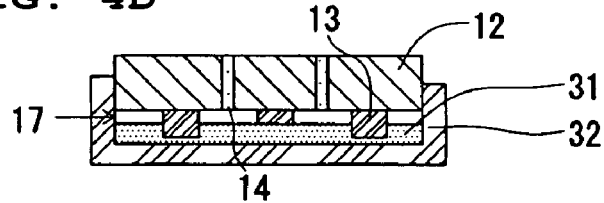
Figure 4E:
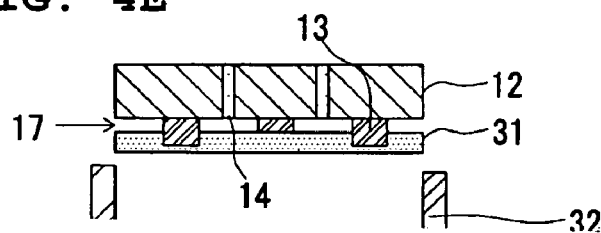

Thereafter, the hardened resin 31 and the base 12 having the elements 13 mounted thereon are removed from the tray 32. FIGS. 4C to 4E are sectional views taken along line B-B' and illustrate steps from the step of inserting the elements 13 into the tray 32 to the step of removing the base 12 and the resin 31 from the tray 32. As shown FIG. 4E, a gap 17 is provided between the removed resin 31 (which defines a cover) and the removed base 12. Therefore, the cover is not in contact with through holes 14.

Third Preferred Embodiment

Figure 5A:
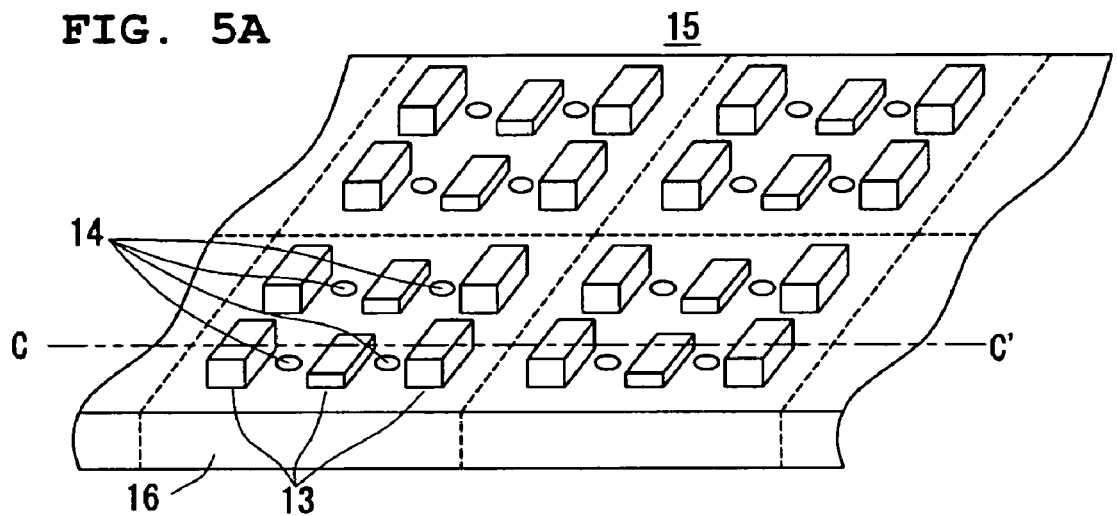
FIG. 5A and FIGS. 5B to 5D are, respectively, an external perspective view and sectional views illustrating a multi-layer substrate, which is an example of an electronic component, in accordance with a third preferred embodiment of the present invention.
Figure 5B:
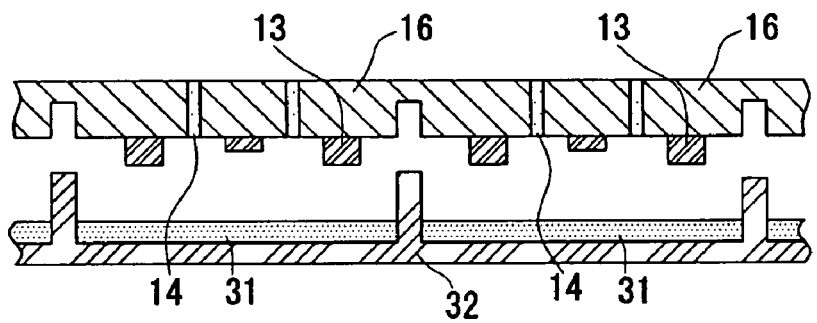
Figure 5C:
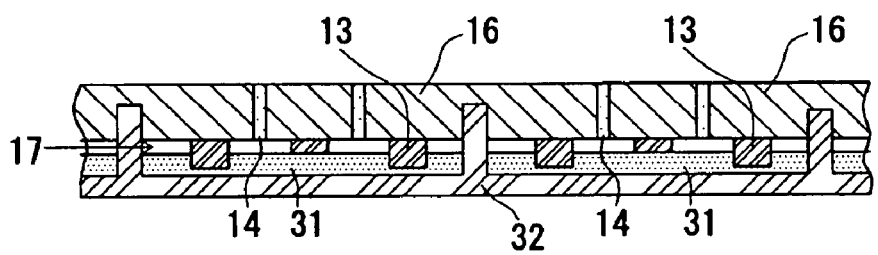
Figure 5D:
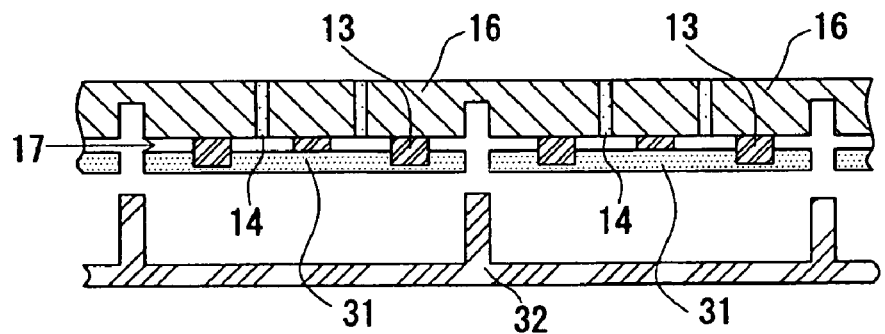

FIG. 5A is an external perspective view and FIGS. 5B to 5D are sectional views for illustrating a method for producing a multi-layer substrate in accordance with a third preferred embodiment of the present invention. In FIGS. 5A to 5D, the present invention is applied to a base cluster 15 prior to dividing it into separate bases. Elements shown in FIGS. 5A to 5D corresponding to those shown in FIG. 1 are given the same reference numerals, and descriptions thereof are omitted.

As shown in FIG. 5A, a base cluster 15 having elements 13 mounted thereon is provided. Notches for individual component breaking are previously formed in the base cluster 15 so as to facilitate subsequent dividing of the base cluster 15 into the separate bases.

A tray (container) 32 having partitions in accordance with the size of the separate bases is filled with a predetermined amount of resin 31, as in the second preferred embodiment.

FIGS. 5B to 5D are sectional views taken along line C-C' and illustrate steps from the step of inserting the elements 13 into the tray 32 to the step of removing bases 12 and the resin 31 from the tray 32. As shown in FIG. 5B, with an element surface of each base 12 to which the elements 13 are mounted facing downward and the bottom surface of each base 12 facing upward, the elements 13 are inserted into the tray 32 to a depth at which each base is not immersed, and the resin 31 is hardened.

Thereafter, the hardened resin 31 and the bases 12 to which the elements 13 are mounted are removed from the tray 32. As shown FIG. 5D, a gap 17 is provided between the removed resin 31 (which defines a cover) and the removed bases 12. Therefore, the cover is not in contact with through holes 14.

Next, the base cluster 15 is divided into separate bases 16 by individual component breaking. Since the elements 13 are inserted into the tray 32 having partitions disposed in accordance with the size of the bases, the cover 31 does not need to be cut.

In the step of inserting the elements 13 into the tray 32, when the base cluster 15 contacts the partitions of the tray 32 and cannot be inserted into the tray 32 to a desired depth, grooves having a depth enabling the partitions of the tray 32 to fit therein are preferably previously formed along the division lines of the bases of the base cluster 15.

Although the present preferred embodiment is described as using the tray 32 with partitions for facilitating the division of the base cluster 15 into the separate bases 16, the tray 32 need not have partitions. In this case, a continuous hardened resin is formed over the base cluster 15. Accordingly, a method of cutting the resin that has been removed from the tray with, for example, a dicer and dividing the base cluster into the separate bases may be performed.

Fourth Preferred Embodiment

FIG. 6A and FIGS. 6B to 6D are, respectively, an external perspective view and sectional views for illustrating a method for producing a multi-layer substrate in accordance with a fourth preferred embodiment of the present invention, in which a plate is disposed on the top surface of a cover. Elements shown in FIGS. 6A to 6D that correspond to those shown in FIG. 1 are given the same reference numerals, and descriptions thereof are omitted.

Figure 6A:
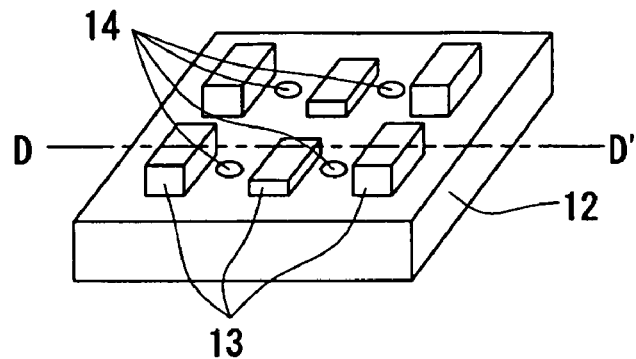
FIG. 6A and FIGS. 6B to 6D are, respectively, an external perspective view and sectional views illustrating a multi-layer substrate, which is an example of an electronic component, in accordance with a fourth preferred embodiment of the present invention.

First, as shown in FIG. 6A, a base 12 having elements 13 mounted thereon is provided.

A sheet-like plate 34, such as a hardened resin plate, a conductive resin plate, or a conductive metallic plate, is previously disposed at the bottom surface of a tray (container) 32. Then, the tray 32 is filled with a predetermined amount of resin 31 as in the second preferred embodiment.

Figure 6B:
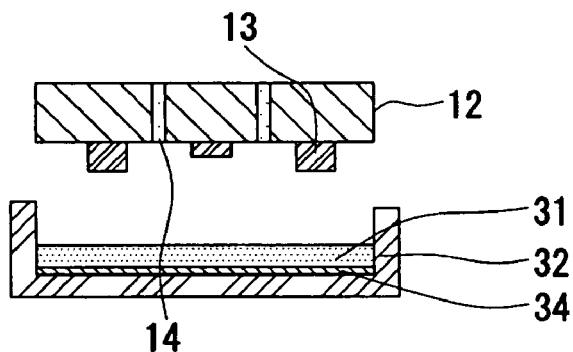
Figure 6C:
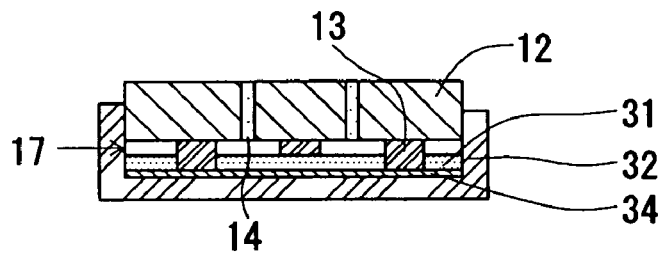
Figure 6D:
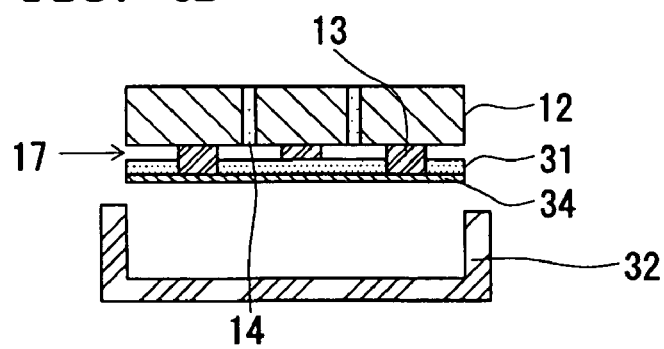

FIGS. 6B to 6D are sectional views taken along line D-D' and illustrate steps from the step of inserting the elements 13 into the tray 32 to the step of removing the base 12 and the resin 31 from the tray 32. As shown in FIG. 6B, with an element surface of the base 12 to which the elements 13 are mounted facing downward and the bottom surface of the base 12 facing upward, the elements 13 are inserted into the tray 32 to a depth at which the base 12 is not immersed, and the resin 31 is hardened.

Then, the hardened resin 31, the plate 34, and the base 12 to which the elements 13 are mounted are removed from the tray 32.

Accordingly, the multi-layer substrate produced in the above-described manner includes a cover defined by the resin 31 and the plate 34. Since the sheet-like plate 34 is previously disposed at the top surface of the cover, the top surface of the cover that has been removed from the tray 32 is flat without further processing after the removal. Therefore, the fourth preferred embodiment is effective in forming a flat surface that facilitates the cover is being mounted to the base.

Fifth Preferred Embodiment

Figure 7:
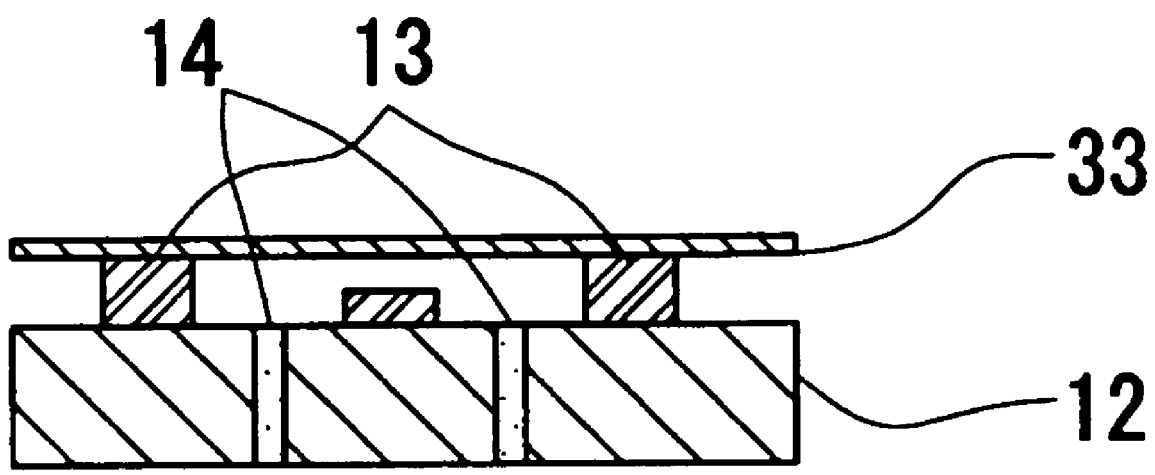
FIG. 7 is a sectional view of a multi-layer substrate, which is an example of an electronic component, in accordance with a fifth preferred embodiment of the present invention.

FIG. 7 is a sectional view of a multi-layer substrate in accordance with a fifth preferred embodiment of the present invention and includes a plate that is directly adhered to elements. Elements shown in FIG. 7 that correspond to those shown in FIG. 1 are given the same reference numerals, and descriptions thereof are omitted.

A plate 33 is formed by previously molding, for example, resin used in any one of the second to fourth preferred embodiments in the form of a sheet. The plate 33 is adhered to at least some of the elements 13 by applying a thermosetting adhesive to the plate 33, placing the plate 33 onto these elements 13, and letting the adhesive undergo thermosetting. In the second to fourth preferred embodiments, particular attention must be given to process control such as, for example, the hardening time and room temperature during the hardening of the resin after immersion of the elements 13 because the resin is a liquid resin or a semi-hardening resin. In contrast, in the fifth preferred embodiment, process control is easily performed because the plate is previously molded in the shape of a sheet.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

What is claimed is:

1. An electronic component comprising:
a base;
a plurality of elements mounted on the base; and
a cover covering the plurality of elements; wherein
the cover is supported by at least some of the plurality of elements; and
a gap is disposed between the cover and the base; wherein
the at least some of the plurality of elements are embedded into a surface of the cover such that top surfaces of the at least some of the plurality of elements do not extend entirely through the cover; and
at least one of the at least some of the plurality of elements that are embedded into the surface of the cover is an integrated circuit;
the gap is defined by a space between the cover and the base in which no additional elements other than the plurality of elements are disposed;
the surface of the cover into which the at least some of the plurality of elements are embedded is substantially parallel to a surface of the base on which the plurality of elements are mounted; and
the cover is supported only by the at least some of the plurality of elements and is not supported by or in direct contact with the base.

2. The electronic component according to claim 1, wherein not every one of the plurality of elements supports the cover.

3. The electronic component according to claim 1, wherein a top surface of a tallest one of the plurality of elements mounted on the base is embedded in the cover.

4. The electronic component according to claim 1, wherein a top surface of the cover is substantially flat.

5. The electronic component according to claim 1, wherein the cover is made of resin.

6. The electronic component according to claim 1, wherein the cover comprises a plate that is adhered to the top surfaces of the at least some of the plurality of elements.

* * * * *